United States Patent
Babcock et al.

(10) Patent No.: US 6,645,868 B1
(45) Date of Patent: Nov. 11, 2003

(54) METHOD OF FORMING SHALLOW TRENCH ISOLATION USING ANTIREFLECTION LAYER

(75) Inventors: Carl P. Babcock, Campbell, CA (US); Jayendra D. Bhakta, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 273 days.

(21) Appl. No.: 09/861,990

(22) Filed: May 17, 2001

Related U.S. Application Data

(62) Division of application No. 09/200,307, filed on Nov. 25, 1998, now Pat. No. 6,255,717.

(51) Int. Cl.[7] .................... H01L 21/762; H01L 21/311
(52) U.S. Cl. ................ 438/703; 438/702; 438/744; 438/950; 438/952; 438/424
(58) Field of Search ................ 438/786, 791, 438/737, 738, 744, 950, 952, 700, 702, 724, 701, 703, 424

(56) References Cited

U.S. PATENT DOCUMENTS

| | | | |
|---|---|---|---|
| 4,758,305 A | 7/1988 | Bonifield et al. | |
| 4,971,655 A | 11/1990 | Stefano et al. | 156/659.1 |
| 5,066,615 A | 11/1991 | Brady et al. | |
| 5,514,499 A | 5/1996 | Iwamatsu et al. | 430/5 |
| 5,639,687 A | 6/1997 | Roman et al. | 437/186 |
| 5,679,599 A | 10/1997 | Mehta | |
| 5,710,073 A | 1/1998 | Jeng et al. | 438/239 |
| 5,712,185 A | 1/1998 | Tsai et al. | |
| 5,728,621 A | 3/1998 | Zheng et al. | 438/622 |
| 5,741,626 A | 4/1998 | Jain et al. | 430/314 |
| 5,858,870 A | 1/1999 | Zheng et al. | 438/622 |
| 5,886,391 A * | 3/1999 | Niroomand et al. | 257/510 |
| 5,958,505 A | 9/1999 | Mantl | 427/96 |
| 5,990,002 A * | 11/1999 | Niroomand et al. | 438/636 |
| 6,004,850 A | 12/1999 | Lucas et al. | 438/301 |
| 6,037,276 A * | 3/2000 | Lin et al. | 438/786 |
| 6,133,613 A | 10/2000 | Yao et al. | 257/437 |
| 6,187,687 B1 * | 2/2001 | Plat et al. | 438/724 |
| 6,228,740 B1 * | 5/2001 | Niroomand et al. | 438/398 |
| 6,294,460 B1 * | 9/2001 | Subramanian et al. | 438/636 |
| 6,383,874 B1 * | 5/2002 | Sun et al. | 438/287 |
| 6,444,588 B1 * | 9/2002 | Holscher et al. | 438/737 |
| 6,500,774 B1 * | 12/2002 | Bhakta | 438/791 |
| 6,514,667 B2 * | 2/2003 | Angelopoulos et al. | 430/271.1 |
| 6,518,206 B1 * | 2/2003 | Kumar et al. | 438/952 |
| 6,541,164 B1 * | 4/2003 | Kumar et al. | 430/5 |
| 6,548,417 B2 * | 4/2003 | Dao et al. | 438/716 |

* cited by examiner

*Primary Examiner*—Mary Wilczewski
(74) *Attorney, Agent, or Firm*—Renner, Otto, Boisselle & Sklar, LLP

(57) ABSTRACT

Shallow trench isolation among transistors and other devices on a semiconductor substrate is provided by initially forming a layer of highly absorbing silicon rich nitride to serve as a hardmask between a semiconductor substrate and a photoresist. The highly absorbing layer of silicon rich nitride has an extinction coefficient (k)>0.5. As reflected light passes through the layer of silicon rich nitride, a substantially amount of light is absorbed therein thereby blocking such reflected light from negatively interfering with patterning of the photoresist during photo-lithography. Following patterning of the photoresist, isolation trenches are formed in the semiconductor substrate by etching through the silicon rich nitride in accordance with the pattern formed on the photoresist.

14 Claims, 6 Drawing Sheets

US 6,645,868 B1

METHOD OF FORMING SHALLOW TRENCH ISOLATION USING ANTIREFLECTION LAYER

This is a divisional application of Ser. No. 09/200,307 filed Nov. 25, 1998, now U.S. Pat. No. 6,255,717.

TECHNICAL FIELD

The present invention relates to a method for forming isolation regions among devices on a semiconductor substrate, and more particularly, to a method of patterning photoresist to form such isolation regions with reduced effects from photo-reflectivity.

BACKGROUND OF THE INVENTION

In the semiconductor industry, there is a continuing trend toward higher device densities. To achieve these high densities there has been and continues to be efforts toward scaling down the device dimensions on semiconductor wafers. In order to accomplish such high device packing density, smaller and smaller features sizes are required. This may include the width and spacing of interconnecting lines and the surface geometry such as corners and edges of various features.

The requirement of small features with close spacing between adjacent features requires high resolution photolithographic processes. In general, lithography refers to processes for pattern transfer between various media. It is a technique used for integrated circuit fabrication in which a silicon slice, the wafer, is coated uniformly with a radiation-sensitive film, the resist, and an exposing source (such as light, x-rays, or an electron beam) illuminates selected areas of the surface through an intervening master template, the mask, for a particular pattern. The lithographic coating is generally a radiation-sensitized coating suitable for receiving a projected image of the subject pattern. Once the image is projected and developed, it is indelibly formed in the coating.

One important aspect of producing an integrated circuit involves the isolation of devices that are built on a semiconductor substrate of a wafer. For instance, isolation becomes extremely important in integrated circuit technology as many hundreds of thousands of devices are produced in a single chip. Improper isolation among transistors may cause current leakages, which can consume significant power for the entire chip. Further, improper isolation can lead to increased noise among devices on the chip.

One known way of isolating devices built on a semiconductor chip involves local oxidation of silicon (LOCOS). LOCOS involves growing silicon dioxide by heating an exposed area of silicon (or silicon covered with a thin layer of silicon dioxide) in an oxygen containing ambient. Prior to LOCOS growth, a wafer will normally be covered with an inert layer of material, such as silicon nitride ($Si_3N_4$), and the nitride layer is patterned to expose the areas selected for LOCOS formation. The localized regions of oxide are then grown in the exposed areas, and the silicon nitride layer is then removed.

Another way of isolating devices built on a semiconductor chip is to form isolation regions between neighboring devices. For instance, using a shallow trench isolation technique, shallow trenches are formed between devices on the semiconductor chip so that a dielectric layer such as silicon oxide may be formed therein to electrically isolate adjacent devices. In order to produce the shallow trenches, a barrier oxide layer is typically formed over a semiconductor substrate, and a silicon nitride layer is formed over the barrier oxide layer. Next, a photoresist is patterned over the silicon nitride layer to serve as a mask when forming the shallow trench. Using the photoresist, the shallow trench is formed through the layers into the semiconductor substrate and is filled with the dielectric material. The photoresist and silicon oxide layer are subsequently removed using conventional techniques.

During any lithographic/etching process such as that involved in forming the shallow trench isolation regions, it is extremely important to control critical dimensions (CDs) such as linewidth and spacing of the photoresist. Unfortunately, the use of highly reflective materials such as metal silicides in photolithography has lead to difficulties in maintaining tight CD control. In particular, undesired and nonuniform reflections from these underlying materials during the photoresist patterning process often causes resulting photoresist patterns to be distorted. Because the photoresist patterns are used as a mask in forming the shallow isolation trenches, such distortions have a corresponding negative impact on the CD control of these trenches.

Distortion in the photoresist are further created during passage of reflected light through a silicon nitride layer $Si_3N_4$ which is used as a hardmask for shallow trench isolation etching. As is conventional, the hardmask serves to provide an additional mask layer for forming the shallow trenches in the event the softer photoresist material becomes eroded prior to or during the isolation trench forming steps. During manufacturing of the semiconductor chip, however, normal fluctuations in the thickness of the hardmask cause a wide range of varying reflectivity characteristics across the silicon nitride layer. As a result, maintaining tight CD control of the photoresist pattern and ultimately the isolation trenches is difficult.

A known method for reducing the negative effects resulting from the reflective materials used in forming a semiconductor chip includes the use of anti-reflective coatings (ARCs). For example, one type of ARC is a polymer film that is formed between the photoresist and the semiconductor substrate. The ARC serves to absorb most of the radiation that penetrates the resist (70–85%) thereby reducing the negative effects stemming from the underlying reflective materials during photoresist patterning. Unfortunately, use of an ARC adds significant drawbacks with respect to process complexity. For instance, in order to utilize an organic or inorganic ARC, the process of manufacturing the semiconductor chip must include a process step for depositing the ARC material, and also a step for prebaking the ARC before spinning the photoresist.

Accordingly, there exists a need in the art for a method of forming a resist pattern for shallow trench isolation which overcomes the drawbacks described above and others.

SUMMARY OF THE INVENTION

The present invention provides a method for forming shallow trench isolation among transistors and other devices on a semiconductor substrate with tight critical dimension (CD) control. Tight critical dimension control is achieved by virtue of including a highly absorbing layer of silicon rich nitride as a hardmask between a photoresist and a barrier oxide layer disposed on a semiconductor substrate. The highly absorbing layer of silicon rich nitride has an extinction coefficient (k)>0.5. As such, not only is the amount of reflectivity reduced but also the variance in reflectivity caused by thickness variations in the conventional silicon nitride layer which adversely affected photoresist patterning is significantly reduced. Also, the manufacturing process is simplified since forming of the silicon nitride layer serves as both a hardmask and an anti-reflective layer and thus no additional manufacturing step is needed to deposit an additional anti-reflective coating. In other words by using a silicon rich nitride layer as a hardmask, the cycle time for manufacturing each wafer is reduced since less manufacturing steps are needed.

Alternatively, rather than including a layer of silicon rich nitride, multiple alternating layers of SiON and $SiO_2$ may be stacked between the semiconductor substrate and the photoresist to achieve substantially the same affects of reduced reflectivity and reduced variance in reflectivity. The number of layers and thickness of each layer of SiON and $SiO_2$ is such that collectively the reflectivity of light during the photo-lithography process does not negatively impact the critical dimensions of the photoresist pattern. Thus, for example, the collective layers of SiON and $SiO_2$ may be such as to provide an extinction coefficient in which k>0.5.

Thus, according to one aspect of the present invention, a photolithographic method for forming isolation trenches is provided. The photolithographic method includes the steps of forming a silicon rich nitride layer over a semiconductor substrate, the silicon rich nitride layer having an extinction coefficient>0.5, patterning a photoresist over the silicon rich nitride layer, and etching a plurality of isolation trenches through said silicon rich nitride layer into said semiconductor substrate.

In accordance with another aspect of the present invention, a photolithographic method for forming isolation trenches is provided. The photolithographic method includes the steps of forming a plurality of light absorbing layers having a combined extinction coefficient>0.5 over a semiconductor substrate, the light absorbing layers alternating between a layer of SiON and a layer of $SiO_2$, patterning a photoresist over the plurality of light absorbing layers, and etching a plurality of isolation trenches through the plurality of light absorbing layers into said semiconductor substrate In accordance with yet another aspect of the present invention, a film stack used in forming shallow trench isolation among integrated circuit components on a wafer is provided. The film stack includes a semiconductor substrate, a silicon rich nitride layer disposed over the semiconductor substrate, the silicon rich nitride layer having an extinction coefficient>0.5; and a photoresist disposed over the silicon rich nitride layer.

In accordance with still another aspect of the present invention, a photolithographic method for pattern transfer is provided. The method includes the steps of forming a silicon rich nitride layer over a semiconductor substrate, the silicon rich nitride layer having an extinction coefficient>0.5, patterning a photoresist over the silicon rich nitride layer, and transferring the pattern of the photoresist to the silicon rich nitride layer.

To the accomplishment of the foregoing and related ends, the invention then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed and the present invention is intended to include all such embodiments and their equivalents. Other objects, advantages and novel features of the invention will become apparent from the following detailed description of the invention when considered in conjunction with the drawings.

DETAILED DESCRIPTION OF THE INVENTION

The present invention will now be described with respect to the accompanying drawings in which like numbered elements represent like parts.

In order to create shallow trench isolation (STI) among components disposed on a wafer with tight critical dimension (CD) control, the present invention provides a silicon rich nitride layer to serve as both a hardmask and an anti-reflective layer during the manufacturing process. In the present invention, the silicon rich nitride layer has a extinction coefficient (k)>0.5. By forming the hardmask of a silicon rich nitride layer, light which is reflected by the semi-conductor substrate and other material during photo-lithographic patterning of the photoresist substantially is absorbed by the silicon rich nitride layer. Thus, thickness variations in the silicon rich nitride layer do not result in non-uniform amounts of light being incident on the photoresist which in turn could result in distortions during photoresist patterning.

Figure 1:
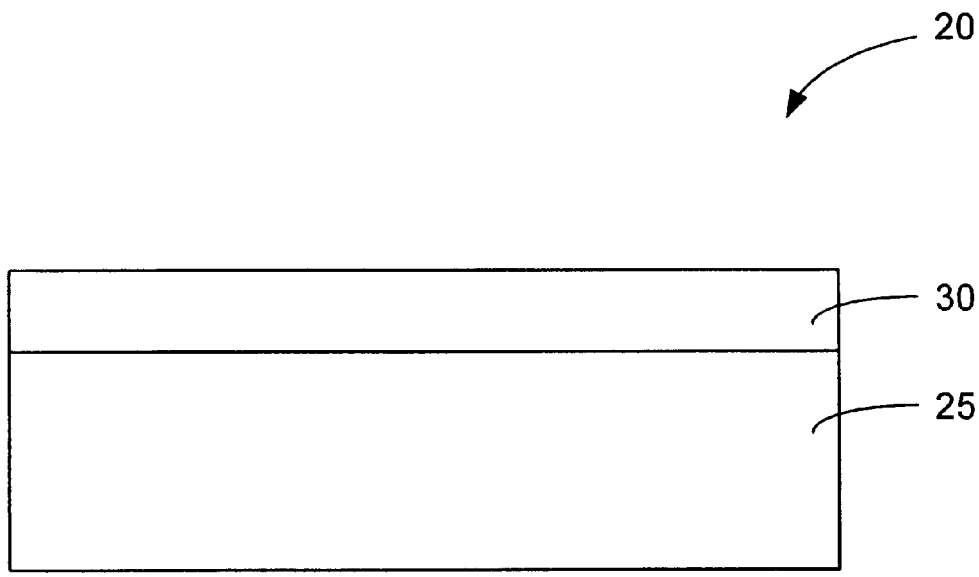
FIG. 1 illustrates a partial cross-sectional view of an integrated circuit wafer during a first process step in forming isolation trenches in the wafer in which a barrier oxide layer is shown above a semiconductor substrate in accordance with the present invention.

Referring initially to FIG. 1, a first process step in forming isolating trenches on a wafer 20 is shown in which a semiconductor substrate 25 is coated with a barrier oxide layer 30. In the present embodiment, the substrate 25 is made of silicon, Si, while the barrier oxide layer 30 is made of silicon oxide, $SiO_2$. As is conventional, the barrier oxide layer 30 serves to block nitrides from passing to the semiconductor substrate during the manufacturing process. In the present embodiment the $SiO_2$ has a thickness of 150 Å however it will be appreciated that such thickness may be varied depending on the application at hand.

Figure 2:
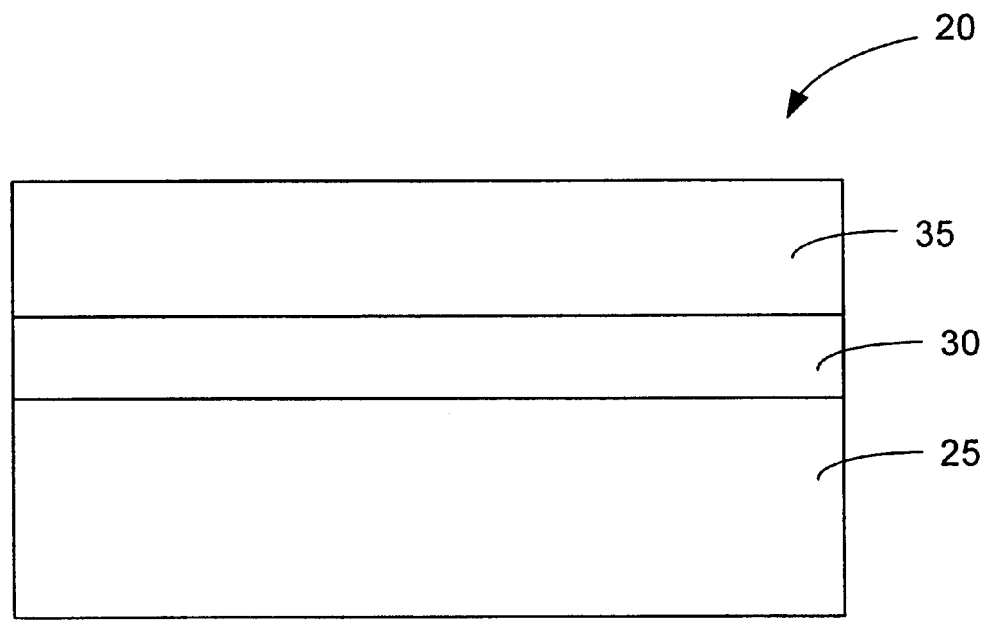
FIG. 2 illustrates a partial cross-sectional view of the wafer of FIG. 1 during a second process step in forming isolation trenches in which a silicon rich nitride layer is formed over the barrier oxide layer.

FIG. 2 shows a second process step in forming isolation trenches on the wafer 20 in which a hardmask 35 composed of a silicon rich nitride is formed on the barrier oxide layer 30. In the present embodiment the hardmask 35 is formed of a silicon rich nitride which has an extinction coefficient (k)>0.5. In particular, the silicon rich nitride of the hardmask 35 of the present invention has a thickness of 500 Å which provides an extinction coefficient of k=0.6. The refractive index of the silicon rich nitride is approximately 2.3 as measured at a wavelength of 230 nm. It will be appreciated that a silicon rich nitride is any silicon rich nitride having a formula $Si_xN_y$ where the ratio of X to Y (i.e. X/Y) is approximately 0.75 or greater. Further, the hardmask 35 may vary in thickness preferably in the range of 100–600 Å depending on the degree of light absorption desired although the thickness may be increased up to 1800 Å or greater in some applications. As will be discussed in more detail below, by providing a hardmask 35 composed of a silicon rich nitride having an extinction coefficient of k>0.5, the present invention allows for providing tighter critical dimension control during patterning of a photoresist which in turn leads to tighter critical dimension control of the shallow trenches formed in the substrate 25. Such tighter critical dimension control is possible since the hardmask absorbs a large percentage of reflected light and thus a non-uniform distribution of reflected light which may otherwise be incident on the photoresist during photo-lithography patterning is substantially absorbed by the hardmask. Further, such tighter critical dimension control is possible without adding extra manufacturing steps which are conventionally necessary to add, for example, a separate anti-reflective coating (ARC) to the wafer 20.

In order to deposit the silicon rich nitride onto the wafer 20, the silicon rich nitride is deposited in a furnace operating at a temperature of approximately 760° C. The gases used in depositing the silicon rich nitride in the furnace include dichloro silane ($SiCl_2H_2$) at a flow rate of 120 standard cubic centimeters per minute (sccm) and amonia ($NH_3$) at a flow rate of 8 sccm thereby giving a 15:1 ratio of $SiCl_2H_2$ to $NH_3$. The pressure in the furnace is set at 200 m torr.

Figure 3:
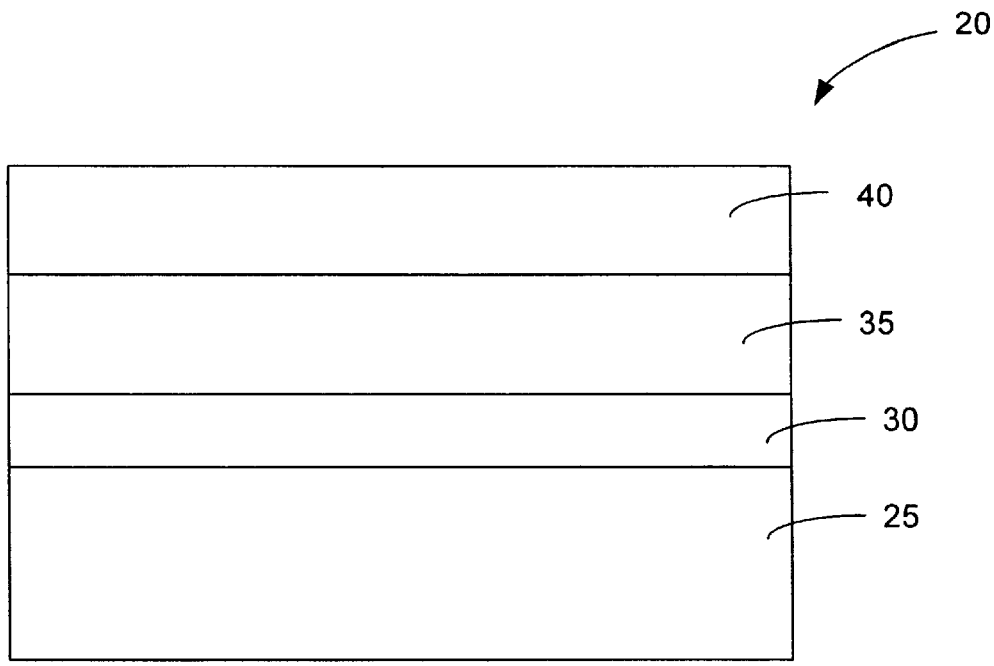
FIG. 3 illustrates a partial cross-sectional view of the wafer of FIG. 2 during a third process step in forming isolation trenches in which a photoresist layer is formed over the silicon rich nitride layer.
Figure 4:
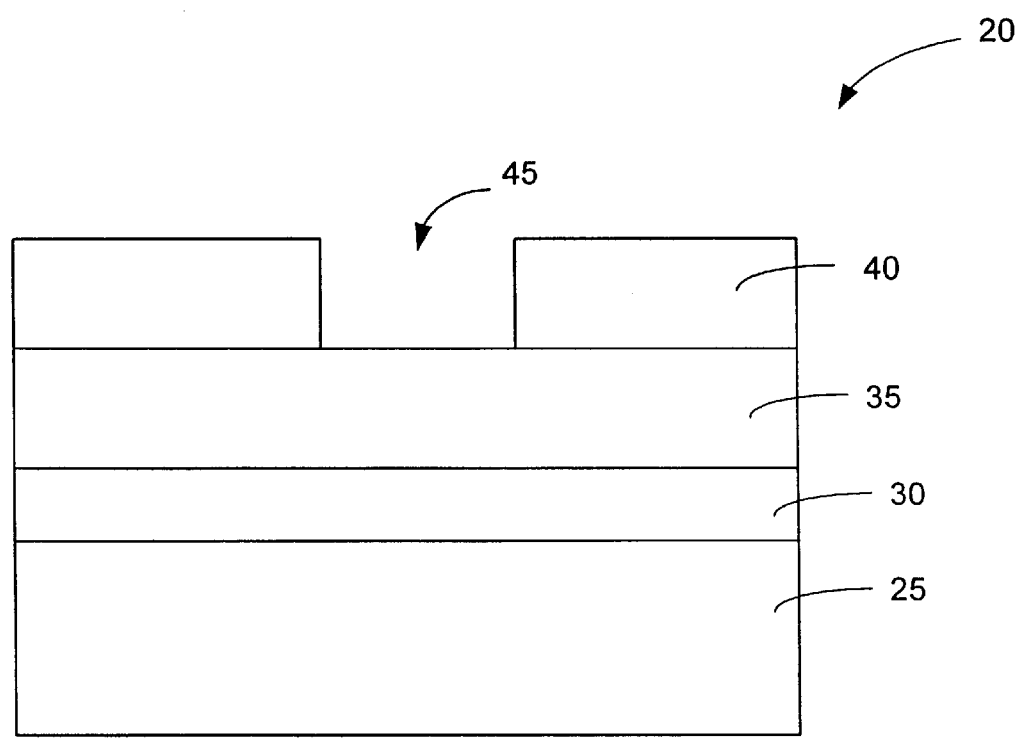
FIG. 4 illustrates a partial cross-sectional view of the wafer of FIG. 3 during a forth process step in forming isolation trenches in which the photoresist layer is patterned to form isolation trenches in the semiconductor substrate.

Referring now to FIG. 3, a third process step in forming isolation trenches is shown in which a photoresist 40 is formed over the hardmask 35. The formation of the photoresist 40 completes a film stack used in forming the shallow trench isolation. The photoresist 40 is composed of a conventional photoresist material which is suitable to be patterned using photo-lithography. FIG. 4 depicts a fourth process step in forming isolation trenches in which the photoresist 40 is patterned to serve as a mask in forming trenches in the substrate 25. For example, referring to FIG. 4, during photo-lithography a series of photoresist trenches 45 (only one shown) are formed in the photoresist 40 to provide a window through which etching of the underlying hardmask 35 and substrate 25 may take place. Thus, if the critical dimensions, such as a line width and spacing, of the photoresist trenches 45 are not closely controlled, distortions occurring in forming of the photoresist trenches 45 will be passed down to the isolation trenches ultimately formed in the substrate 25. As mentioned above, conventionally such distortions in patterning the photoresist 40 occurred partly due to thickness variations in the hardmask 35 which caused non-uniform photo-reflectivity and due to varying degrees of reflectivity occurring from underlying materials such as the substrate 25 and other electronic components disposed therein. However, as the hardmask 35 of the present invention has a high extinction coefficient wherein k>0.5, the light which passes through the resist 40 tends to be absorbed by the hardmask 35 and the light which is reflected by underlying layers below the hardmask 35 or by the hardmask 35 itself is also substantially absorbed within the hardmask 35 prior to being reflected back onto the photoresist 40 thereby reducing variations which would otherwise occur in the critical dimensions of the photoresist trenches 45.

Figure 5:
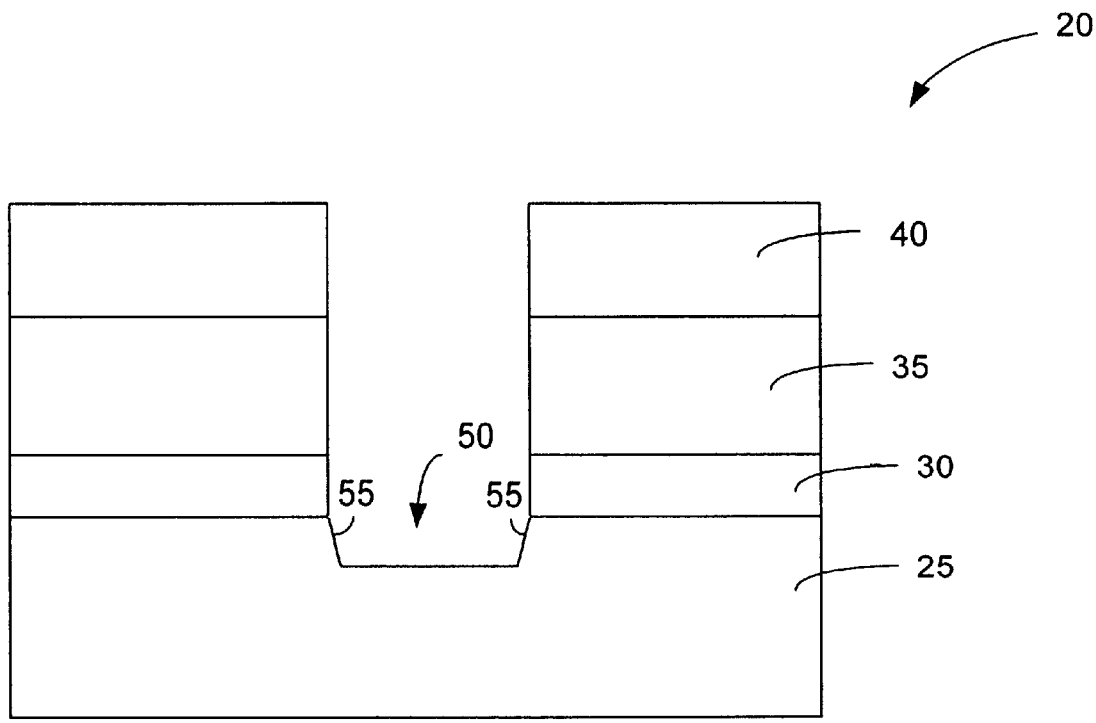
FIG. 5 illustrates a partial cross-sectional view of the wafer of FIG. 4 during a fifth process step in forming isolation trenches in which trenches are formed into the semiconductor substrate in accordance with the patterned photoresist.

Referring now to FIG. 5, a fifth process step in forming isolation trenches is shown in which a shallow isolation trench 50 is formed in the substrate. The shallow isolation trench 50 is formed by conventional plasma etching of the hardmask 35, barrier oxide layer 30 and substrate 25. In the present embodiment, the plasm etching of the hardmask 35/barrier oxide layer 30 and substrate 25 occurs in two consecutive plasma etching steps, however, it will be appreciated that plasm etching of the hardmask 35, barrier oxide layer 30 and substrate 35 could occur in a single step. As seen in FIG. 5, the isolation trench 50 formed during the plasma etching is trapezoidal in shape and has side walls 55 which are angled approximately 70° with respect to a horizontal line. It will be appreciated, however, that the isolation trenches 50 may be shaped in other appropriate shapes and the present invention is not limited to having isolation trenches which are trapezoidal in shape. The depth of the isolation trenches 50 may also vary from one application to another, however in the present embodiment the depth of the isolation trench 50 is approximately 3500 Å.

Figure 6:
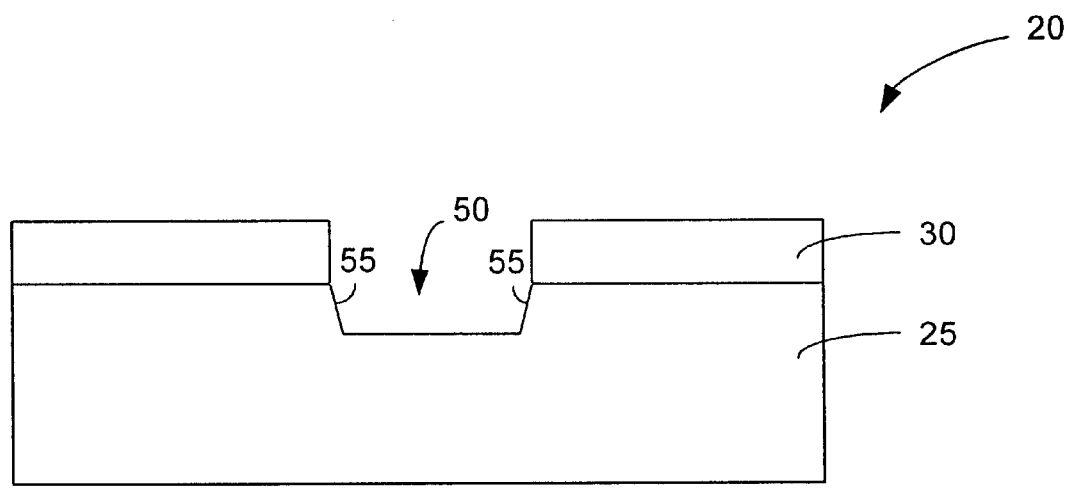
FIG. 6 illustrates a partial cross-sectional view of the wafer of FIG. 5 during a sixth process step in forming isolation trenches in which the photoresist layer and silicon rich nitride layers are stripped from the wafer.

Referring now to FIG. 6, a sixth process step in forming isolation trenches is shown in which the hardmask 35 and photoresist 40 are stripped from the wafer 20. Stripping of photoresist 40 occurs in accordance with conventional photoresist stripping techniques. Stripping of the hardmask 35 also occurs using conventional techniques such as wet stripping, and in the present embodiment is accomplished using phosphoric acid as a wet strip solution.

Figure 7:
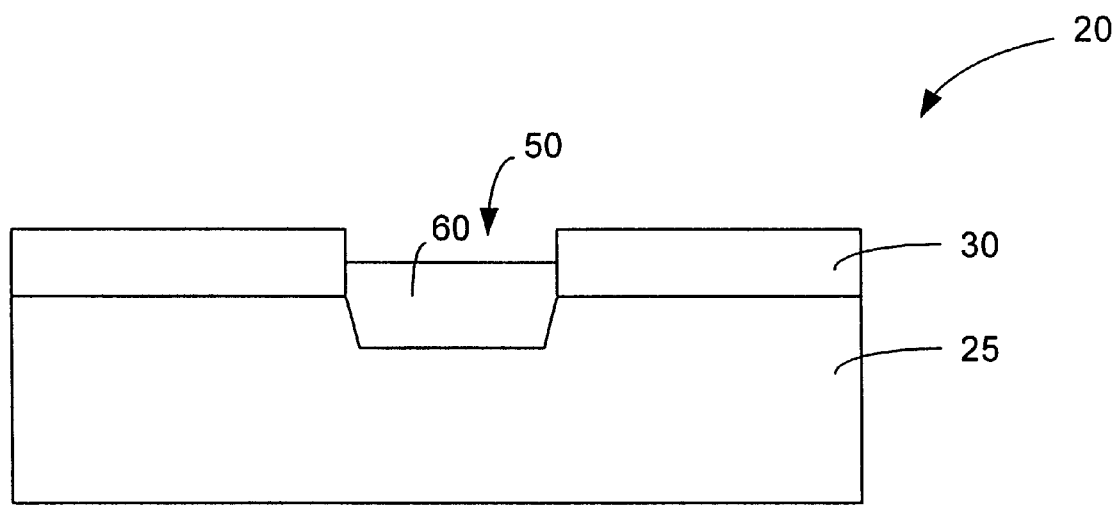
FIG. 7 illustrates a partial cross-sectional view of the wafer of FIG. 6 during a seventh process step in forming isolation trenches in which a dielectric material is formed in the trenches in the semiconductor substrate.

Referring now to FIG. 7, a seventh process step in forming isolation trenches is shown in which a dielectric material is formed in the isolation trenches 50. In the present embodiment, the dielectric material formed in the isolation trenches 50 is silicon oxide, $SiO_2$ which is formed from a TEOS gas, however other appropriate dielectric materials could alternatively be used. The dielectric material serves to electrically isolate adjacent components on the substrate 25 from one another.

Figure 8:
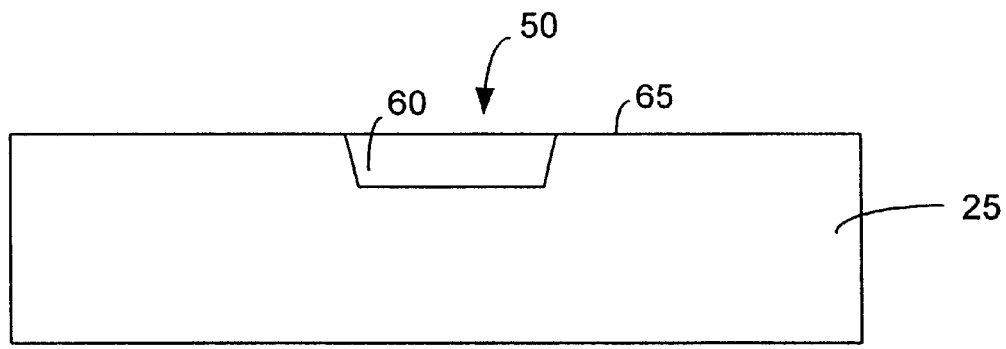
FIG. 8 illustrates a partial cross-sectional view of the wafer of FIG. 7 during an eighth process step in forming isolation trenches in which the dielectric material is polished to be substantially flush with a top surface of the semiconductor substrate.

Referring now to FIG. 8, following formation of the dielectric material 60 in the isolation trenches 50, an eighth and final step of isolating devices on the substrate 25 is depicted in which the dielectric material 60 formed over the substrate 25 and in the isolation trenches 50 are polished in order to planarize the entire substrate surface. Following polishing, the dielectric material 60 filled in the isolation trenches 50 is substantially flush with a top surface 65 of the substrate 25 as shown in FIG. 8. At this point, the formation of the isolation trenches 50 in the substrate 25 which are suitable for electrically isolating adjacent components from one another is completed, and the wafer 20 is progressed to the next stage in the overall manufacturing process.

As discussed above, because the hardmask 35 of the present invention has an extinction coefficient wherein k>0.5, the critical dimensions of the photoresist trenches 45 are not significantly affected by the thickness variations in the hardmask 35 or other non-uniformities in reflected light. Thus, when patterning the photoresist 40 using a conventional photo-lithographic process, the critical dimensions of the photoresist trenches 45 are not negatively impacted by varying degrees of reflected light being incident thereon. Further, because the hardmask 35 itself serves as an anti-reflective coating, manufacturability of the wafer 20 is simplified since no additional process step is needed to form an extra anti-reflective coating on the substrate 25. This in turn leads to a shorter cycle time in manufacturing of wafers 20.

Figure 9:
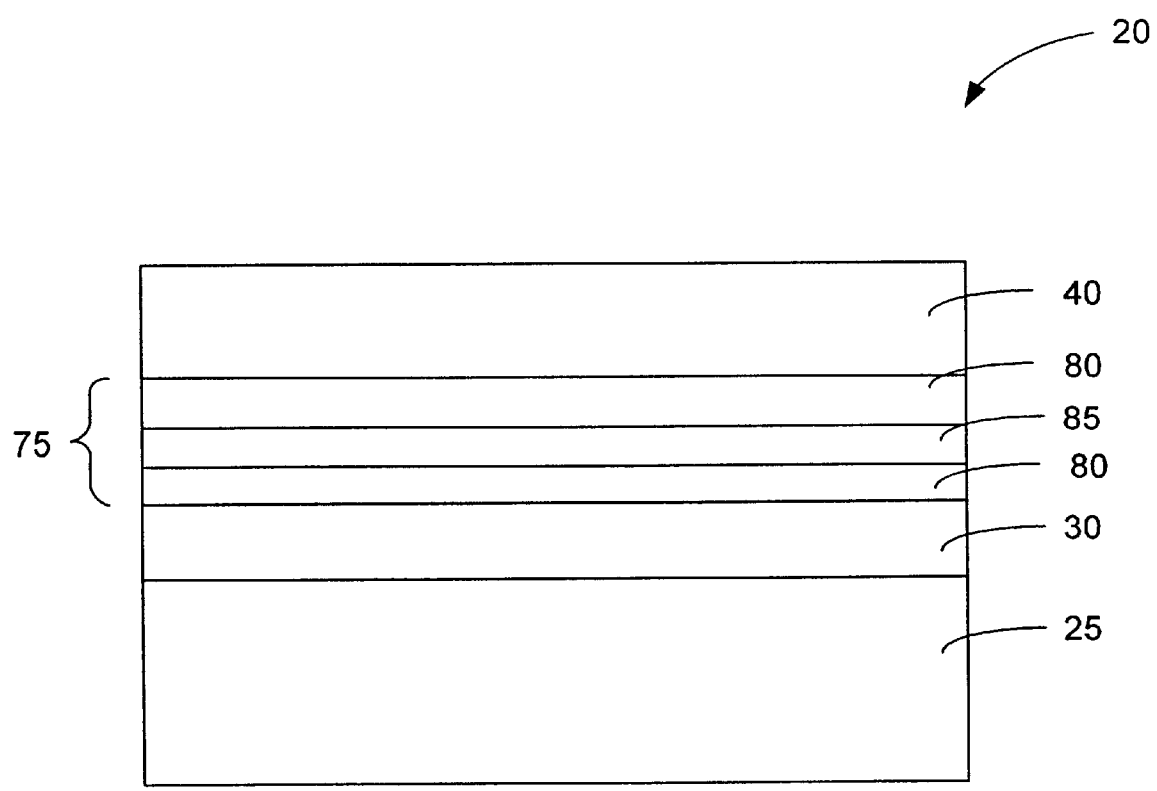
FIG. 9 illustrates a partial cross-sectional view of a wafer according to an alternative embodiment of the present invention in which alternate layers of SiON and $SiO_2$ are deposited over a semiconductor substrate to collectively serve to reduce the effects of light reflectivity on photoresist pattern.

Referring now to FIG. 9, an alternative embodiment of the present invention is depicted in which a multilayer stack 75 of light absorbing material is formed over the substrate 25. The multilayer stack 75 is composed of alternating layers of SiON 80 and $SiO_2$ 85 as shown in FIG. 9. Each layer of SiON and $SiO_2$ is preferably between 100 and 400 Å in thickness and in the present invention each layer has a thickness of 250 Å. The combined extinction coefficient of the multilayer stack 75 is such that k>0.5 thereby allowing for patterning of the photoresist 40 without a significant negative impact on the critical dimensions of the photoresist trenches 45 which would otherwise occur from variations in the intensity of reflected light incident on the photoresist during photo-lithography. In the present embodiment the multilayer stack 75 includes three light absorbing layer in which two layers of SiON 80 sandwich a layer of $SiO_2$ 85. It will be appreciated, however, that two or more layers of light absorbing material may be used depending on the desired amount of light absorption needed for a particular application.

The process of forming an isolation trench 50 in the substrate 25 and filling the isolation trench 50 with a dielectric material 60 in the present embodiment is substantially similar to the steps described above with respect to FIGS. 1–8 and with the exception that the multilayer stack 75 is used in place of the hardmask 35. As such, the process of forming the isolation trench 50 is not again shown for sake of brevity.

Figure 10:
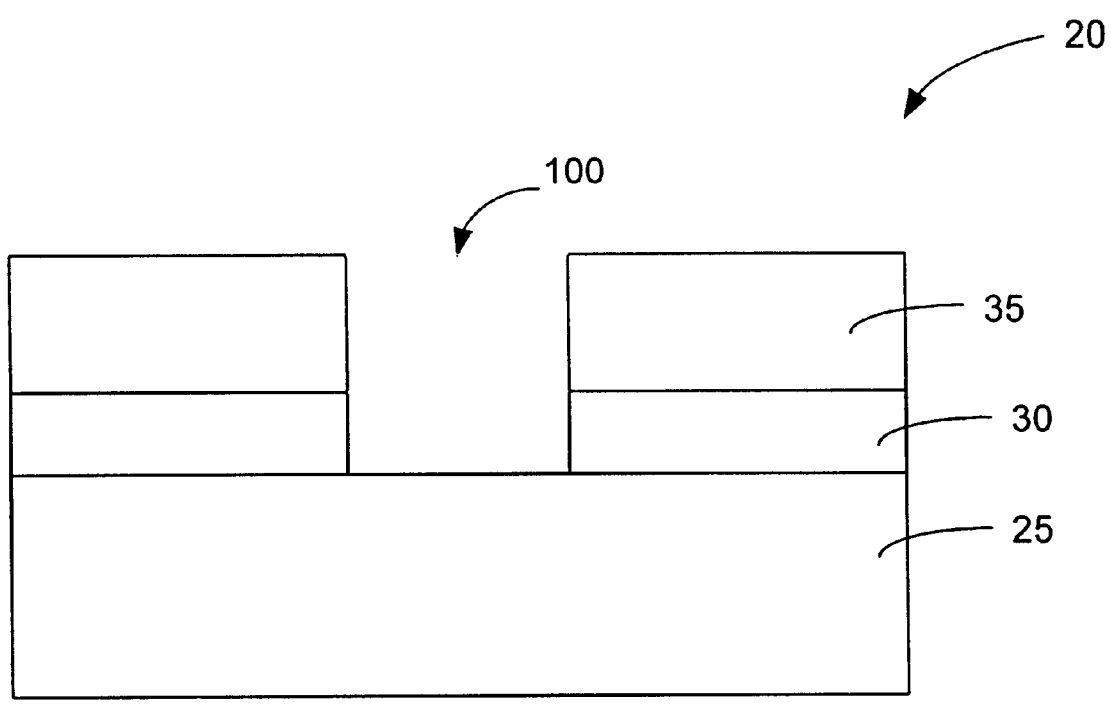
FIG. 10 illustrates a partial cross-sectional view of the wafer of following etching of the silicon rich nitride layer and barrier oxide layer just prior to applying LOCOS isolation techniques in accordance with the present invention.

The invention has been described with reference to the preferred embodiments. Obviously, modifications and alterations will occur to others upon reading and understanding the preceding detailed description. For example, although the present invention has been described with respect to patterning a photoresist for forming shallow trench isolation among components on a wafer, the present invention may also be used in conjunction with contact patterning, via patterning, damascene and/or LOCOS. In particular, briefly referring to FIG. 10, in the event the present invention was used in conjunction with LOCOS, the barrier oxide layer 30 and hardmask 35 would be patterned and etched in substantially the same manner as described above with respect to FIGS. 1–5 except that the substrate 25 would not be etched to form isolation trenches 50. Rather, once the hardmask 32 and oxide layer 30 are etched, conventional LOCOS techniques would be used to grow an oxide within regions 100.

It is intended that the invention be construed as including all such modifications alterations, and equivalents thereof and is limited only by the scope of the following claims.

What is claimed is:

1. A photolithographic method for forming isolation trenches, comprising the steps of:

forming a silicon rich nitride layer over a semiconductor substrate, the silicon rich nitride layer having an extinction coefficient>0.5;

patterning a photoresist over the silicon rich nitride layer; and etching a plurality of isolation trenches through said silicon rich nitride layer into said semiconductor substrate.

2. The photolithographic method of claim 1, wherein the silicon rich nitride layer has a thickness of between 100–600 Å.

3. The photolithographic method of claim 2, wherein the silicon rich nitride layer has a thickness of 500 Å.

4. The photolithographic method of claim 1, wherein the silicon rich nitride layer has a refractive index of approximately 2.3.

5. The photolithographic method of claim 1, wherein the silicon rich nitride layer has the formula $Si_xN_y$ where X and Y are integers of one or greater and the ratio of X to Y is 0.75 or greater.

6. The photolithographic method of claim 1, wherein k=0.6.

7. The photolithographic method of claim 1, wherein a barrier oxide layer is formed over the semiconductor substrate, and the silicon rich nitride layer is formed over the barrier oxide layer.

8. The photolithographic method of claim 7, wherein the silicon rich nitride layer is formed directly on the barrier oxide layer.

9. The photolithographic method of claim 1, wherein the barrier oxide layer comprises $SiO_2$.

10. The photolithographic method of claim 1, wherein the semiconductor substrate comprises Si.

11. A photolithographic method for pattern transfer and forming isolation trenches, comprising the steps of:

forming a silicon rich nitride layer over a semiconductor substrate, the silicon rich nitride layer having an extinction coefficient>0.5;

patterning a photoresist over the silicon rich nitride layer;

transferring the pattern of the photoresist to the silicon rich nitride layer; and etching a plurality of isolation trenches through the silicon rich nitride layer into said semiconductor substrate.

12. The method of claim 11, wherein the step of transferring includes the step of etching the silicon rich nitride layer.

13. The photolithographic method of claim 11, wherein a barrier oxide layer is first formed on the semiconductor substrate and the silicon rich nitride layer is formed over the barrier oxide layer.

14. The photolithographic method of claim 13, wherein the silicon rich nitride layer is formed directly on the barrier oxide layer.

* * * * *